United States Patent

Palazzi et al.

[11] Patent Number: 6,081,471
[45] Date of Patent: Jun. 27, 2000

[54] SEMICONDUCTOR INTEGRATED, ELECTRONIC CONTROL CIRCUIT INCORPORATING AN ELECTRICALLY PROGRAMMABLE, ELECTRONIC NON-VOLATILE MEMORY DEVICE

[75] Inventors: Michele Palazzi, Genova; Virginia Natale, Milan; Luca Fontanella, Venezia, all of Italy

[73] Assignee: STMicroelectronics S.r.l., Agrate Brianza, Italy

[21] Appl. No.: 09/239,884

[22] Filed: Jan. 29, 1999

[30] Foreign Application Priority Data

Jan. 30, 1998 [IT] Italy .................... MI98A0171

[51] Int. Cl.[7] .................................... G11C 7/00
[52] U.S. Cl. .................. 365/218; 365/189.12; 365/63
[58] Field of Search .................. 371/3; 365/226, 365/189.09, 185.29, 185.2, 189.12, 218, 63

[56] References Cited

U.S. PATENT DOCUMENTS 5,199,032  3/1993  Sparks et al. .................. 371/3
5,444,664  8/1995  Kuroda et al. .................. 365/226

Primary Examiner—David Nelms
Assistant Examiner—Thong Le
Attorney, Agent, or Firm—Theodore E. Galanthay; Robert Iannucci; Seed And Berry LLP

[57] ABSTRACT

An integrated electronic control circuit comprises a microcontroller connected to at least one volatile memory, at least one input/output port, a plurality of control devices, and an electronic non-volatile memory device comprising a non-volatile memory cell matrix linked to a control register, and a switch element connected between a voltage reference and the cell matrix to enable the program mode of the cell matrix under control by the microcontroller.

9 Claims, 1 Drawing Sheet

SEMICONDUCTOR INTEGRATED, ELECTRONIC CONTROL CIRCUIT INCORPORATING AN ELECTRICALLY PROGRAMMABLE, ELECTRONIC NON-VOLATILE MEMORY DEVICE

TECHNICAL FIELD

This invention relates to a semiconductor integrated, electronic control circuit incorporating an electrically programmable, electronic non-volatile memory device.

The invention is, particularly but not exclusively, directed to a programmable type of integrated electronic control circuit including integrated analog devices, along with digital devices operative to control the analog devices. The circuit is, particularly but not exclusively, intended for controlling electromechanical devices, and the description that follows will cover this field of application for simplicity of illustration.

BACKGROUND OF THE INVENTION

As is well known, in the specific field of this invention, SSP (Super Smart Power) power devices are currently employed which have analog, power and signal components, as well as digital control components for controlling the power components, both integrated on the same semiconductor die.

The control action is generally provided and managed by a microcontroller which runs a control program stored in a memory, also provided on the same die.

In particular, memories of the ROM type or the OTP EPROM (One Time Programmable EPROM) type are integrated for that purpose.

This approach has certain drawbacks in applications where calibration parameters are to be introduced in order to exert an adequate control action on each specimen of the device to be controlled.

The above requirement is currently met by having these parameters stored in memories other than those storing the control program. These memories are of the non-volatile type, such as EEPROMs, and are also integrated on the same die as the microcontroller. However, due to the high area requirements of the basic cell, non-volatile memories must be dimensioned to occupy the least possible amount of circuit area.

This prior approach affects the versatility of the control program in that only a limited number of parameters of the device to be controlled can be stored.

Another possible solution would be that of storing such calibration parameters into memories outside the die.

While achieving its objective, not even this solution would be devoid of drawbacks. In fact, it is important for certain applications that the number of pins taken up by the connections to external circuitry be kept as small as possible. Furthermore, the use of external memories adds to the complexity of the control action for managing the external memories.

SUMMARY OF THE INVENTION

An embodiment of this invention provides an electronic control circuit which can be readily programmed according to the external devices to be controlled. The circuit has such constructional and functional features as to allow the calibration parameters to be also stored after the initial programming, thereby to overcome the limitations and/or drawbacks with which prior art devices are still beset.

The control circuit is a semiconductor integrated, electronic control circuit which comprises a microcontroller and a non-volatile memory device having a matrix of non-volatile memory cells, and a switch element for causing the matrix of memory cells to enter the program mode under control by the microcontroller.

The microcontroller is connected to at least one volatile memory, at least one input/output port, a plurality of control devices, and an electronic non-volatile memory device comprising a matrix of non-volatile memory cells linked to a control register. The electronic control circuit comprises a switch element connected between a voltage reference and said cell matrix to enable the program mode of the cell matrix under control by the microcontroller.

Advantageously, the switch element is driven by the control register connected to the matrix.

Advantageously, the switch element is a p-channel MOS transistor.

The features and advantages of a circuit according to the invention will be apparent from the following description of an embodiment thereof, given by way of non-limitative example with reference to the accompanying drawings.

DETAILED DESCRIPTION

Figure 1:
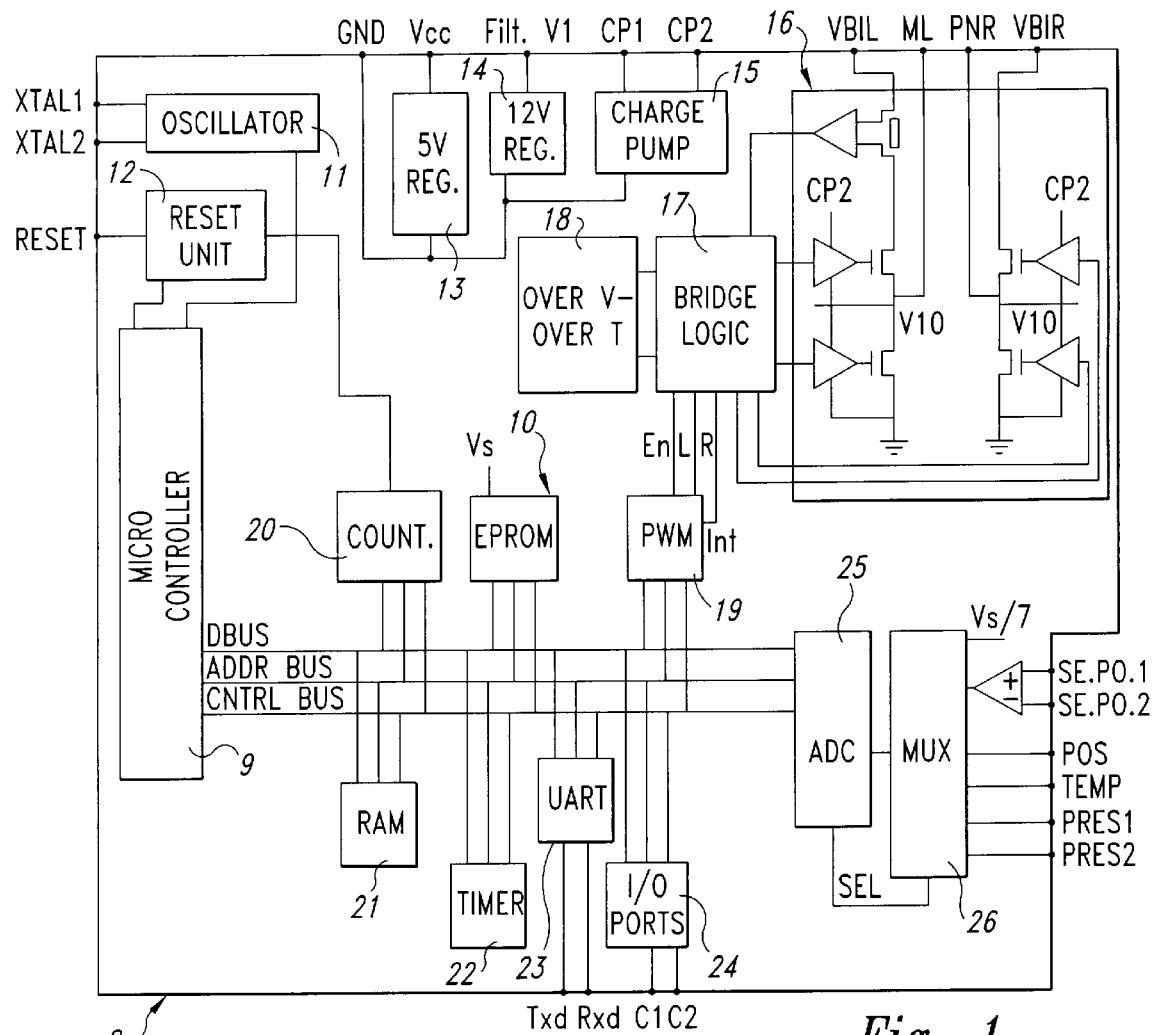
FIG. 1 is a block diagram of an electronic control circuit according to the invention.

Shown in FIG. 1 is a block diagram of an electronic control circuit 8 according to an embodiment of this invention. The control circuit 8 comprises a microcontroller 9, such as a compatible Motorola HC05 microcontroller, which is connected to an electronic memory device 10 through data lines D BUS, address lines ADDR BUS, and control lines CNTRL BUS.

Figure 2:
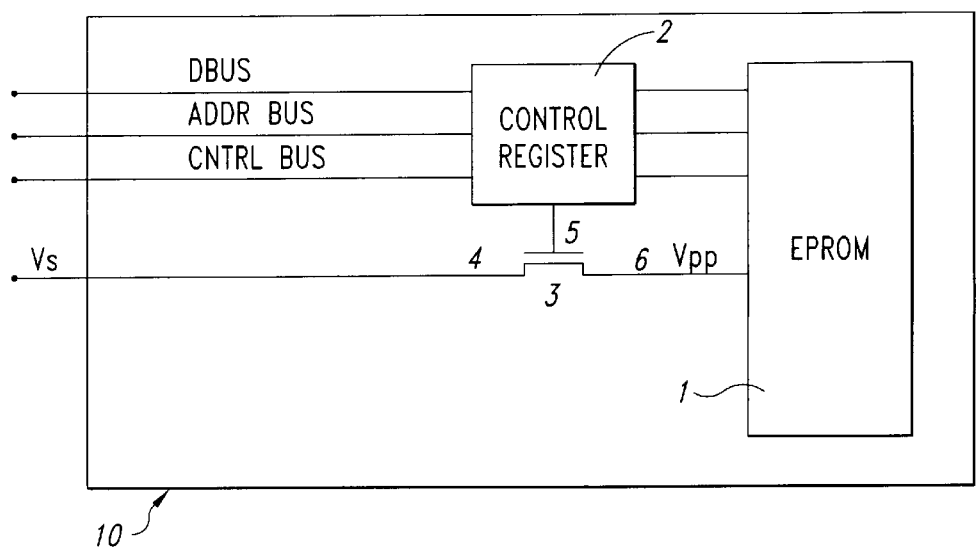
FIG. 2 shows an electronic memory device as integrated to the circuit of this invention.

In FIG. 2, individual components of the electronic memory device 10 are shown. This device 10 comprises a matrix 1 of memory cells, e.g., a 4 kbyte EPROM cell matrix. This EPROM matrix 1 is controlled by a control register 2 and connected to the lines D BUS, ADDR BUS, and CNTRL BUS.

Advantageously, a switch element 3 is provided which has a first terminal 4 connected to a voltage reference Vs, a second terminal 5 connected to the control register 2 of the EPROM, and a third terminal 6 connected to the terminal for the program voltage Vpp of the EPROM 1.

In particular, the switch element 3 can be a MOS transistor. Advantageously, the MOS transistor is a p-channel transistor because this type of transistor can be readily integrated to operate on the program voltage Vpp of the EPROM 1, and has a relatively small intrinsic operational resistance $R_{DSon}$, which allows more accurate provisions to be made for reliability after integrating the memory device 10 on the die.

The MOS transistor may be a high voltage transistor, for example.

Connected to the microcontroller 9 are a conventional oscillator 11, necessary to the operation of the microcontroller 9, and a conventional reset unit 12.

Shown at 16 is the power section of the control circuit 10, which section is controlled from a logic block 17 and an over voltage-over temperature block 18.

The logic block 17 is driven by a constant frequency, variable duty cycle modulator 19 which is also connected to the microcontroller through the lines D BUS, ADDR BUS and CNTRL BUS.

Further connected to the microcontroller 9 are a counter 20 functioning to reset the circuit 8, a RAM 21 having, for example, a 256 byte capacity, a further timer 22, an interface 23 for managing the outward connections, and an analog-to-digital converter 25 having a multiplexer 26 connected thereto to pick up different signals from the circuit outside for setting the control circuit 8.

The input of the multiplexer 26 can also be applied a signal ($V_s/7$) proportional to the supply voltage Vs. The indication from this signal is processed through the control program to prevent supply voltage spikes from destroying the EPROM 1.

The control circuit 8 is additionally provided with a first regulator 13 for supplying a low voltage to the digital section of the control circuit, and a second regulator 14 connected to a charge pump 15 for driving, at a higher voltage than said low voltage, the analog power section of the control circuit.

The manner of entering the calibration data of the control program of the control circuit 8 to the EPROM cell matrix 1 will now be described.

The control program can be loaded into the EPROM 1 before actually installing the control circuit 8 in the user's apparatus, for example.

Once the control circuit 8 is installed, in order to store calibration data into the EPROM matrix 1, a supply voltage Vs, equal to the program voltage Vpp of the memory cell matrix 1, is applied.

Before applying the supply voltage Vs to stored the calibration data in the EPROM cell matrix 1, a portion of the control program is transferred into the RAM 21. This operation is made necessary because the EPROM cell matrix 1 cannot be read from and written in simultaneously.

Thereafter, the switch 3 is operated by a control signal from the register 2, and the EPROM cell matrix 1 caused to enter the write or program mode.

Upon entering the program mode, the calibration parameters are stored into the EPROM cell matrix 1. The switch 3 then is turned off and the memory cell matrix 1 is caused to exit the program mode.

In summary, the electronic control circuit of this invention allows the control action of each device to be calibrated by having an electronic memory device, provided with a switch to control the store phase of the memory device, jointly integrated with a microcontroller.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated electronic control circuit, comprising:
    a non-volatile memory having a data input, an address input, and a program enable input;
    a control register having a data output, an address output, and a program enable output, the data and address outputs being coupled to the data and address inputs, respectively; and
    a control switch having a control terminal coupled to the program enable output, a first conduction terminal coupled to a voltage reference, and a second conduction terminal coupled to the program enable input of the non-volatile memory, the control switch being structured to electrically connect the voltage reference to the program enable input in response to receiving a program enable signal from the control register and thereby cause data from the data output of the control register to be stored in the non-volatile memory at an addressed indicated by the address output of the control register.

2. The electronic control circuit of claim 1, further comprising a microcontroller having data, address, and control outputs coupled to data, address, and control inputs, respectively, of the control register, the control register producing the program enable signal in response to receiving a control signal from the microcontroller.

3. The electronic control circuit of claim 1 wherein the non-volatile memory includes an EPROM.

4. The electronic control circuit of claim 1 wherein the control switch includes a p-channel MOS transistor.

5. The electronic control circuit of claim 1, further comprising a volatile memory coupled to the non-volatile memory, the control register being disabled from writing to the non-volatile memory while program data is being transferred from the non-volatile memory to the volatile memory.

6. A control method, comprising:
    storing a control program in a non-volatile memory;
    storing calibration data in a control register;
    transferring the calibration data from the control register to the non-volatile memory in response to receiving a program enable signal at a program input of the non-volatile memory; and
    switching the program input of the non-volatile memory into electrical connection with a voltage reference in response to a control signal, the voltage reference providing the program enable signal to the program input of the non-volatile memory.

7. The control method of claim 6, further comprising transferring at least a portion of the control program from the non-volatile memory to a volatile memory before storing the calibration data in the non-volatile memory.

8. The control method of claim 6 wherein the switching act includes providing a control signal to a control terminal of a switch from a control register.

9. The control method of claim 8 wherein the switch act further includes using a microcontroller to cause the control register to provide the control signal to the switch.

* * * * *